United States Patent
Yoo

(10) Patent No.: US 10,910,541 B2
(45) Date of Patent: Feb. 2, 2021

(54) THERMOELECTRIC ELEMENT

(71) Applicant: LG INNOTEK CO., LTD., Seoul (KR)

(72) Inventor: Young Sam Yoo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 196 days.

(21) Appl. No.: 16/068,854

(22) PCT Filed: Jan. 13, 2017

(86) PCT No.: PCT/KR2017/000491
§ 371 (c)(1),
(2) Date: Jul. 9, 2018

(87) PCT Pub. No.: WO2017/123057
PCT Pub. Date: Jul. 20, 2017

(65) Prior Publication Data
US 2019/0027670 A1 Jan. 24, 2019

(30) Foreign Application Priority Data
Jan. 13, 2016 (KR) .................. 10-2016-0004352

(51) Int. Cl.
*H01L 35/08* (2006.01)
*H01L 35/16* (2006.01)
(Continued)

(52) U.S. Cl.
CPC .............. *H01L 35/08* (2013.01); *H01L 35/16* (2013.01); *H01L 35/32* (2013.01); *H01L 35/34* (2013.01)

(58) Field of Classification Search
None
See application file for complete search history.

(56) References Cited

U.S. PATENT DOCUMENTS

| 4,255,247 A * | 3/1981 | Oda ............... C25B 11/04 204/290.01 |
| 9,012,760 B2 | 4/2015 | Chen et al. |
| 2010/0170550 A1* | 7/2010 | Hiroyama ........... H01L 35/08 136/205 |

FOREIGN PATENT DOCUMENTS

| JP | 2012-253178 | 12/2012 |
| KR | 10-2012-0115079 | 10/2012 |

(Continued)

OTHER PUBLICATIONS

Tan, Ming et al.; "Improved Thermoelectric Performance of a Film Device Induced by Densely Columnar Cu Electrode"; Science Direct; Jun. 1, 2014; vol. 70; pp. 143-148.
(Continued)

*Primary Examiner* — Eli S Mekhlin
*Assistant Examiner* — Dujuan A Horton
(74) *Attorney, Agent, or Firm* — KED & Associates, LLP

(57) ABSTRACT

A thermoelectric element according to one embodiment of the present invention comprises: a first substrate; a plurality of P-type thermoelectric legs and a plurality of N-type thermoelectric legs that are alternately arranged on the first substrate; a second substrate disposed on the plurality of P- and N-type thermoelectric legs; and a plurality of electrodes that connect the plurality of P- and N-type thermoelectric legs in series, wherein the plurality of electrodes include a plurality of first electrodes disposed between the first substrate and the plurality of P- and N-type thermoelectric legs, and a plurality of second electrodes disposed between the second substrate and the plurality of P- and N-type thermoelectric legs, and grains constituting at least one of the plurality of first and second electrodes grow in the direction from the first substrate to the second substrate.

14 Claims, 7 Drawing Sheets

(51) Int. Cl.
*H01L 35/32* (2006.01)
*H01L 35/34* (2006.01)

(56) References Cited

FOREIGN PATENT DOCUMENTS

KR     10-1237235     3/2013
KR     10-1460880     11/2014
WO    WO 2010/111462     9/2010

OTHER PUBLICATIONS

International Search Report (with English Translation) and Written Opinion dated Apr. 14, 2017 issued in Application No. PCT/KR2017/000491.

* cited by examiner

THERMOELECTRIC ELEMENT

CROSS-REFERENCE TO RELATED PATENT APPLICATIONS

This application is a U.S. National Stage Application under 35 U.S.C. § 371 of PCT Application No. PCT/KR2017/000491, filed Jan. 13, 2017, which claims priority to Korean Patent Application No. 10-2016-0004352, filed Jan. 13, 2016, whose entire disclosures are hereby incorporated by reference.

TECHNICAL FIELD

The present invention relates to a thermoelectric element, and more specifically, to an electrode included in a thermoelectric element.

BACKGROUND ART

Thermoelectric effect is a phenomenon caused by movements of electrons and holes in a material and which means direct energy conversion between heat and electricity.

A thermoelectric element is a generic term for an element using thermoelectric effect and includes an element using a temperature variation of electrical resistance, an element using Seebeck effect in which an electromotive force is generated due to a temperature difference, an element using Peltier effect that is a phenomenon in which heat absorption or heating occurs due to a current, and the like.

Thermoelectric elements are widely applied to home appliances, electronic components, and communication components, and the demand for thermoelectric performance of thermoelectric elements is increasing.

The thermoelectric element includes a substrate, an electrode, and a thermoelectric leg. The thermoelectric leg is disposed between an upper substrate and a lower substrate, and an upper electrode and a lower electrode are disposed between the thermoelectric leg, the upper substrate, and the lower substrate. Here, the upper electrode and the lower electrode connect the thermoelectric legs in series and transfer heat and electricity. At this point, the performance of the thermoelectric element may be determined according to heat and electricity flows in the upper electrode and the lower electrode.

Generally, the electrode may be made of copper (Cu) and may be formed on the substrate by electroplating. Accordingly, a growth direction of Cu in the electrode is not convergence but divergence, and thus bunches of grains may exist. Phonon scattering may occur in the electrode due to these grains. The phonon scattering may hinder a heat flow in the electrode, and thus thermoelectric performance of the thermoelectric element may be degraded.

DISCLOSURE

Technical Problem

The present invention is directed to providing a thermoelectric element having improved heat flow performance.

Technical Solution

One aspect of the present invention provides a thermoelectric element including a first substrate, a plurality of P-type thermoelectric legs and a plurality of N-type thermoelectric legs, which are alternately disposed on the first substrate, a second substrate disposed on the plurality of P-type thermoelectric legs and the plurality of N-type thermoelectric legs, and a plurality of electrodes configured to serially connect the plurality of P-type thermoelectric legs and the plurality of N-type thermoelectric legs, wherein the plurality of electrodes include a plurality of first electrodes disposed between the first substrate, the plurality of P-type thermoelectric legs, the plurality of N-type thermoelectric legs, and a plurality of second electrodes disposed between the second substrate, the plurality of P-type thermoelectric legs, and the plurality of N-type thermoelectric legs, and grains constituting at least one of the plurality of first electrodes and the plurality of second electrodes are grown in a direction starting from the first substrate toward the second substrate.

The grains constituting at least one of the plurality of first electrodes and the plurality of second electrodes may contain copper (Cu) and chromium (Cr).

The grains constituting at least one of the plurality of first electrodes and the plurality of second electrodes may be deposited by sputtering.

At least one of the plurality of first electrodes and the plurality of second electrodes may be formed of an alloy containing Cu in a range of 97.4 to 99 wt % and Cr in a range of 1 to 2.6 wt %.

The grains constituting the plurality of first electrodes may be grown in a direction starting from the first substrate toward the second substrate, and the grains constituting the plurality of second electrodes may be grown in a direction different from the growth direction of the grains constituting the plurality of first electrodes.

The grains constituting the plurality of second electrodes may be grown in a direction parallel to the first substrate and the second substrate.

The grains constituting the plurality of first electrodes may contain Cu and Cr, and the grains constituting the plurality of second electrodes may contain Cu.

The grains constituting the plurality of first electrodes may be deposited by sputtering, and the grains constituting the plurality of second electrodes may be formed by electroplating.

The thermoelectric element may further include at least one of a plurality of third electrodes disposed between the first substrate, the plurality of P-type thermoelectric legs, the plurality of N-type thermoelectric legs, and a plurality of fourth electrodes disposed between the second substrate, the plurality of P-type thermoelectric legs, and the plurality of N-type thermoelectric legs.

The grains constituting the plurality of first electrodes and the plurality of second electrodes may be grown in a direction starting from the first substrate toward the second substrate, and grains constituting the plurality of third electrodes and the plurality of fourth electrodes may be grown in a direction different from the growth direction of the grains constituting the plurality of first electrodes and the plurality of second electrodes.

The grains constituting the plurality of third electrodes and the plurality of fourth electrodes may be grown in a direction parallel to the first substrate and the second substrate.

The grains constituting the plurality of first electrodes and the plurality of second electrodes may contain Cu and Cr, and the grains constituting the plurality of third electrodes and the plurality of fourth electrodes may contain Cu.

The grains constituting the plurality of first electrodes and the plurality of second electrodes may be deposited by sputtering, and the grains constituting the plurality of third electrodes and the plurality of fourth electrodes may be formed by electroplating.

At least one of the plurality of first electrodes and the plurality of second electrodes may include a region in which grains are grown in a first direction and a region in which grains are grown in a second direction.

The first direction may be a direction starting from the first substrate toward the second substrate, and the second direction may be a direction parallel to the first substrate and the second substrate.

The region in which the grains are grown in the first direction may be a region in contact with the plurality of P-type thermoelectric legs and the plurality of N-type thermoelectric legs, and the region in which the grains are grown in the second direction may be a region which is not brought into contact with the plurality of P-type thermoelectric legs and the plurality of N-type thermoelectric legs.

Another aspect of the present invention provides a cooling device having a thermoelectric element, the cooling device including a first substrate, a plurality of P-type thermoelectric legs and a plurality of N-type thermoelectric legs, which are alternately disposed on the first substrate, a second substrate disposed on the plurality of P-type thermoelectric legs and the plurality of N-type thermoelectric legs, and a plurality of electrodes configured to serially connect the plurality of P-type thermoelectric legs and the plurality of N-type thermoelectric legs, wherein the plurality of electrodes include a plurality of first electrodes disposed between the first substrate, the plurality of P-type thermoelectric legs, the plurality of N-type thermoelectric legs, and a plurality of second electrodes disposed between the second substrate, the plurality of P-type thermoelectric legs, and the plurality of N-type thermoelectric legs, and grains constituting at least one of the plurality of first electrodes and the plurality of second electrodes are grown in a direction starting from the first substrate toward the second substrate.

Advantageous Effects

In accordance with the embodiments of the present invention, a thermoelectric element having high performance can be obtained. Particularly, a thermoelectric element having high performance can be obtained by optimizing both heat and electricity flows in electrodes.

MODES OF THE INVENTION

Figure 1:
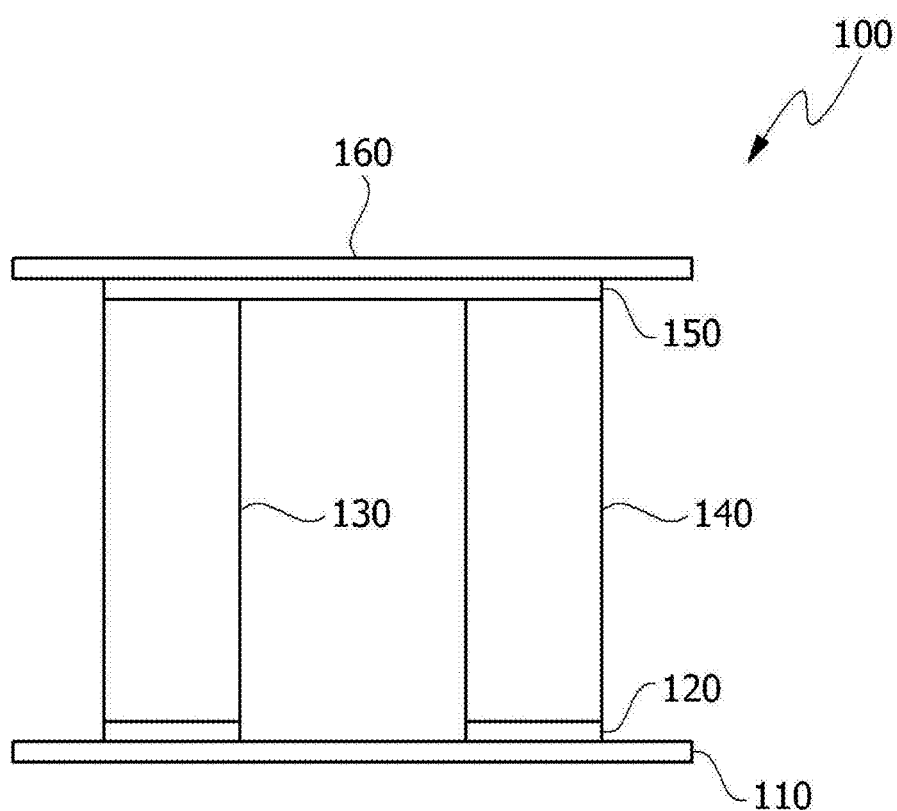
FIG. 1 is a cross-sectional view of a thermoelectric element.

The present invention may be modified into various forms and may have a variety of embodiments, and, therefore, specific embodiments will be illustrated in the drawings and described. The embodiments, however, are not to be taken in a sense which limits the present invention to the specific embodiments, and should be construed to include modifications, equivalents, or substituents within the spirit and technical scope of the present invention.

Also, the terms including ordinal numbers such as first, second, and the like used herein may be used to describe various components, but the various components are not limited by the terms. The terms are used only for the purpose of distinguishing one component from another component. For example, without departing from the scope of the present invention, a second component may be referred to as a first component, and similarly, a first component may also be referred to as a second component. The term "and/or" includes a combination of a plurality of related listed items or any one item of the plurality of related listed items.

When a component is referred to as being "connected" or "coupled" to another component, it may be directly connected or coupled to another component, but it should be understood that yet another component may exist between the component and another component. Contrarily, when a component is referred to as being "directly connected" or "directly coupled" to another component, it should be understood that yet another component may be absent between the component and another component.

The terms used herein are employed to describe only specific embodiments and are not intended to limit the present invention. Unless the context clearly dictates otherwise, the singular form includes the plural form. It should be understood that the terms "comprise," "include," and "have" specify the presence of stated herein features, numbers, steps, operations, components, elements, or combinations thereof, but do not preclude the presence or possibility of adding one or more other features, numbers, steps, operations, components, elements, or combinations thereof.

Unless otherwise defined, all terms including technical or scientific terms used herein have the same meaning as commonly understood by those skilled in the art to which the present invention pertains. General terms that are defined in a dictionary shall be construed as having meanings that are consistent in the context of the relevant art and are not to be interpreted as having an idealistic or excessively formalistic meaning unless clearly defined in the present application.

Hereinafter, embodiments of the present invention will be described in detail with reference to the drawings, the same reference numerals are given to the same or corresponding components regardless of a number of the drawing, and a repetitive description thereof will be omitted.

Figure 2:
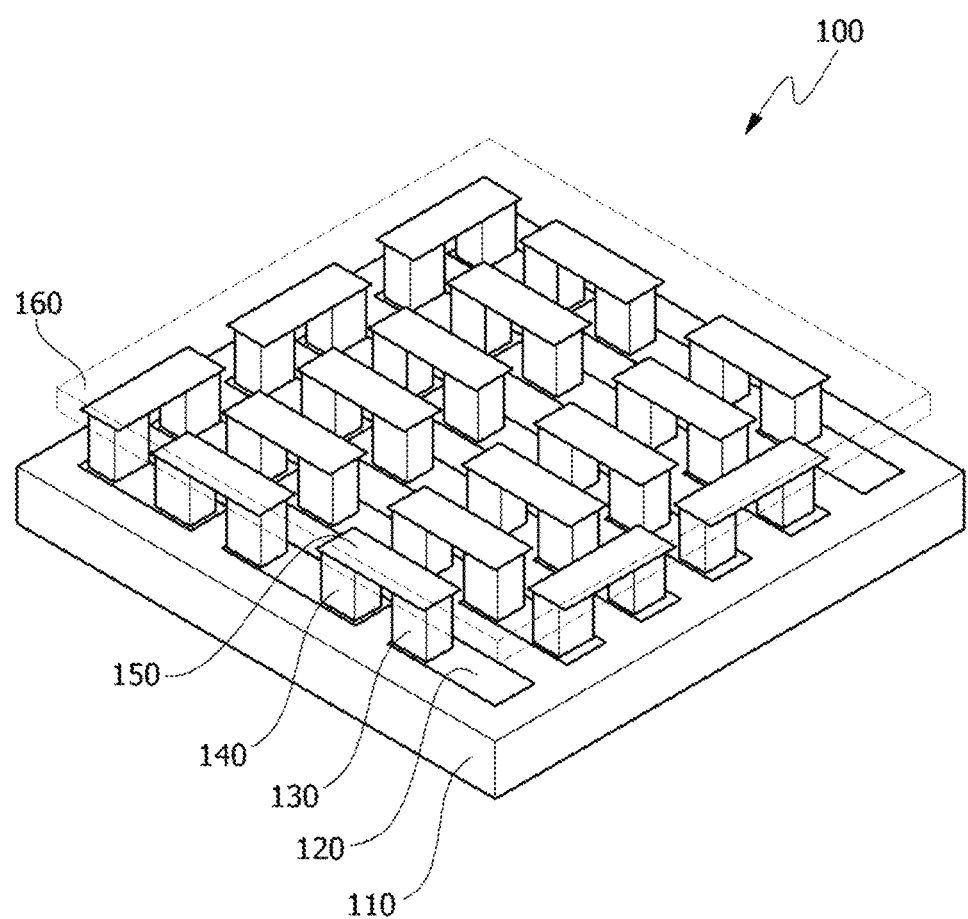
FIG. 2 is a perspective view of a thermoelectric element.

FIG. 1 is a cross-sectional view of a thermoelectric element, and FIG. 2 is a perspective view of a thermoelectric element.

Referring to FIGS. 1 and 2, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are electrically connected by the lower electrode 120 and the upper electrode 150.

For example, when a voltage is applied to the lower electrode 120 and the upper electrode 150 through lead wires, a substrate through which a current flows from the P-type thermoelectric leg 130 to the N-type thermoelectric leg 140 as a result of Peltier effect may absorb heat to serve as a cooling part, and a substrate through which a current flows from the N-type thermoelectric leg 140 to the P-type thermoelectric leg 130 may be heated to serve as a heating part.

Here, each of the P-type thermoelectric leg 130 and the N-type thermoelectric leg 140 may be a bismuth telluride (Bi—Te)-based thermoelectric leg containing Bi and Ti as main raw materials. The P-type thermoelectric leg 130 may be a Bi—Te-based thermoelectric leg containing at least one from among antimony (Sb), nickel (Ni), aluminum (Al), copper (Cu), silver (Ag), lead (Pb), boron (B), gallium (Ga), Te, Bi, and indium (In). The N-type thermoelectric leg 140 may be a Bi—Te-based thermoelectric leg containing at least one from among selenium (Se), nickel (Ni), aluminum (Al), copper (Cu), silver (Ag), lead (Pb), boron (B), gallium (Ga), Te, Bi, and indium (In).

Each of the P-type thermoelectric leg 130 and the N-type thermoelectric leg 140 may be formed in a bulk type or a stacked type. Generally, a bulk P-type thermoelectric leg 130 or a bulk N-type thermoelectric leg 140 may be obtained by heat treating a thermoelectric material to produce an ingot, crushing and sieving the ingot to obtain a thermoelectric leg powder, sintering the thermoelectric leg powder, and cutting the sintered body. A stacked P-type thermoelectric leg 130 or a stacked N-type thermoelectric leg 140 may be obtained by applying a paste containing a thermoelectric material on a sheet-shaped substrate to form a unit member, stacking the unit member, and cutting the stacked unit member.

Performance of a thermoelectric element according to one embodiment of the present invention may be expressed by a Seebeck index. A Seebeck index ZT may be expressed as shown in Equation 1.

[Equation 1]

$$ZT = \alpha^2 \cdot \sigma \cdot T/k$$

Here, α is a Seebeck coefficient (V/K), σ is electrical conductivity (S/m), and $\alpha^t \sigma$ is a power factor (W/mK²). Further, T is a temperature, and k is thermal conductivity (W/mK). k may be expressed as $a \cdot c_p \cdot \rho$, a is thermal diffusivity (cm²/S), $c_p$ is a specific heat (J/gK), and ρ is density (g/cm³).

In order to obtain a Seebeck coefficient of a thermoelectric element, a Z value (V/K) is measured using a Z-meter, and a Seebeck index (ZT) may be calculated using the measured Z value.

Figure 3:
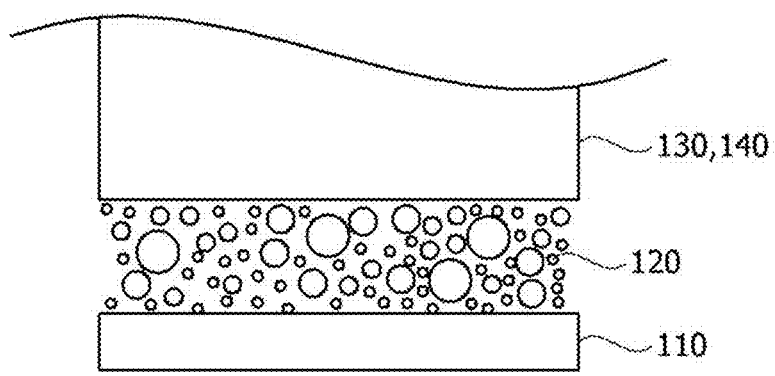
FIG. 3 is a mimetic diagram of an electrode formed by electroplating.
Figure 4:
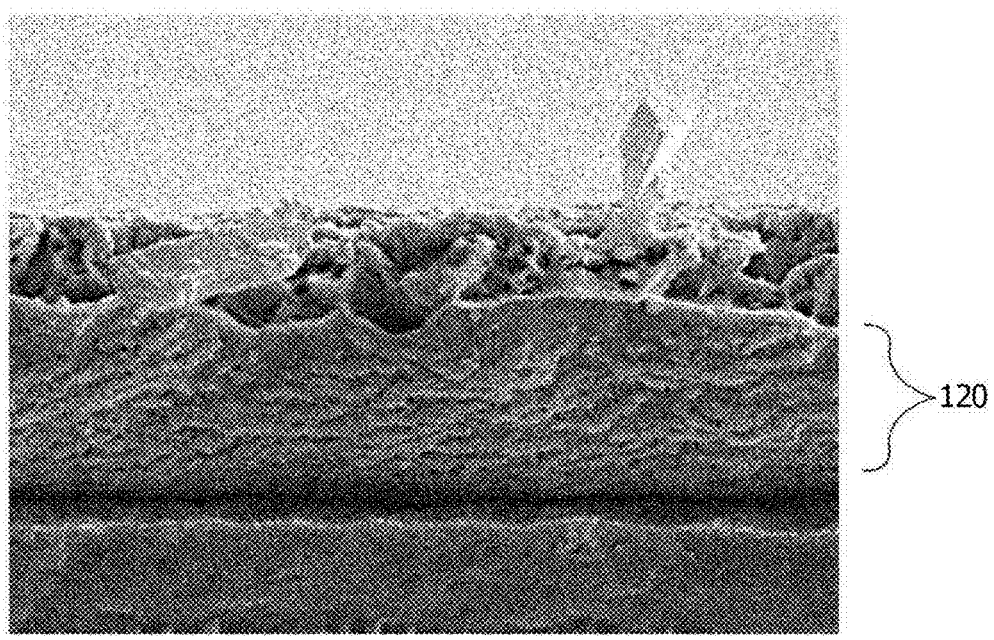
FIG. 4 is a scanning electron microscope (SEM) photograph of a cross section of the electrode formed by electroplating.

Generally, the lower electrode 120 disposed between the lower substrate 110, the P-type thermoelectric leg 130, and the N-type thermoelectric leg 140, and the upper electrode 150 disposed between the upper substrate 160, the P-type thermoelectric leg 130, and the N-type thermoelectric leg 140 are made of Cu and are formed by electroplating. Accordingly, a growth direction of Cu of each of the lower electrode 120 and the upper electrode 150 is not constant, and bunches of grains, in which Cu agglomerates are present, in the lower electrode 120 and the upper electrode 150. FIG. 3 is a mimetic diagram of an electrode formed by electroplating, and FIG. 4 is a scanning electron microscope (SEM) photograph of a cross section of the electrode formed by electroplating. Referring to FIGS. 3 to 4, it can be seen that a growth direction of Cu in the electrode is not constant, bunches of grains in which Cu agglomerates are present, and the grains are formed in a direction parallel to the substrate. In this case, when heat flows in a direction starting from the substrate to the thermoelectric leg or flows in an opposite direction, the grains cause phonon scattering, such that the heat flow may be hindered and thermoelectric performance of the thermoelectric element may be degraded.

According to one embodiment of the present invention, a growth direction and a composition of the electrode are controlled to improve a heat flow.

Figure 5:
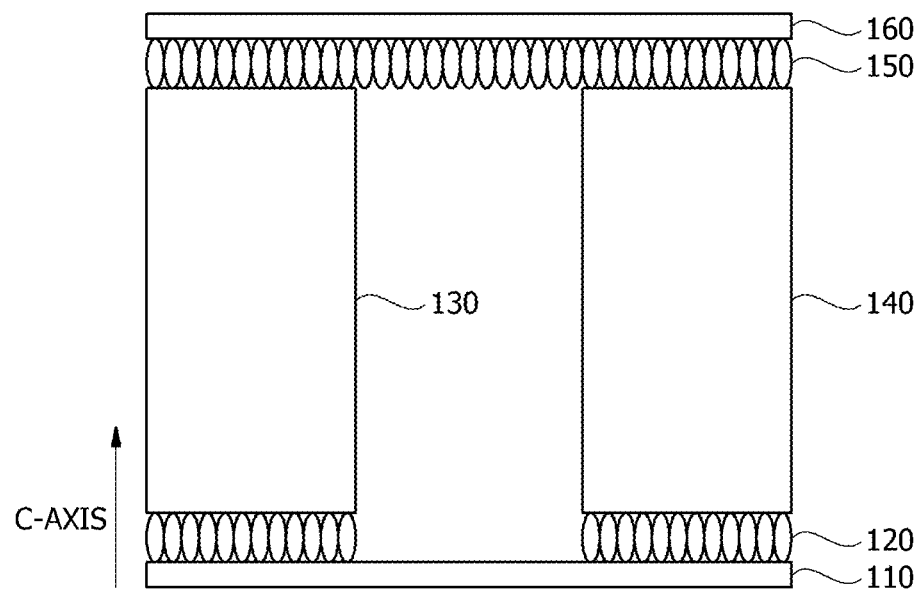
FIG. 5 is a cross-sectional view of a thermoelectric element according to one embodiment of the present invention.
Figure 6:
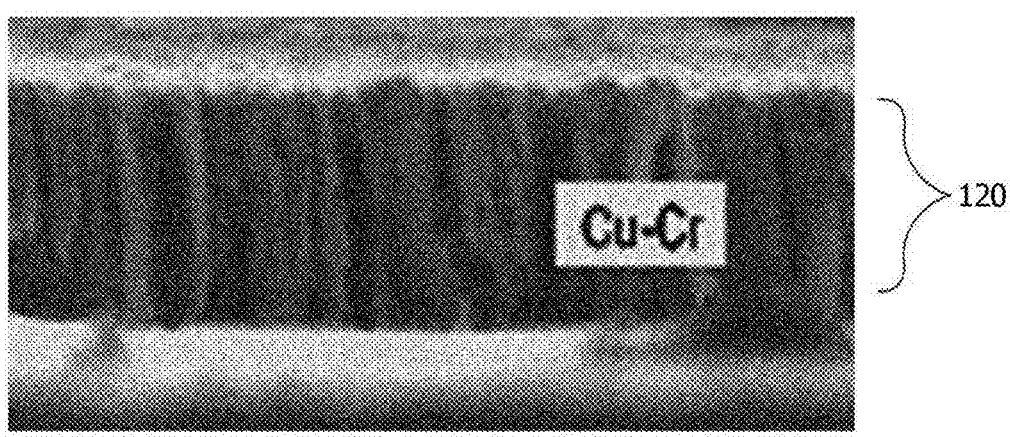
FIG. 6 is a SEM photograph of a cross section of an electrode of the thermoelectric element according to one embodiment of the present invention.

FIG. 5 is a cross-sectional view of a thermoelectric element according to one embodiment of the present invention, and FIG. 6 is a SEM photograph of a cross section of an electrode of the thermoelectric element according to one embodiment of the present invention.

Referring to FIGS. 5 and 6, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are alternately disposed and are electrically connected by the lower electrode 120 and the upper electrode 150.

Here, grains constituting each of the lower electrode 120 and the upper electrode 150 are grown in a direction starting from the lower substrate 110 toward the upper substrate 160 (i.e., a C-axis). That is, the growth direction of the grains constituting each of the lower electrode 120 and the upper electrode 150 is the same as a direction of a heat flow in each of the P-type thermoelectric leg 130 and the N-type thermoelectric leg 140. Accordingly, probability of phonon scattering in each of the lower electrode 120 and the upper electrode 150 is minimized to facilitate the heat flow.

To this end, each of the lower electrode 120 and the upper electrode 150 is deposited by sputtering and may be formed of an alloy containing Cu and chromium (Cr). In this case, Cu is contained in the range of 97.4 wt % to 99 wt %, and Cr is contained in the range of 1 to 2.6 wt %. When the lower electrode 120 and the upper electrode 150 are deposited by sputtering, Cr may be a seed for a C-axis growth. Accordingly, the grains constituting each of the lower electrode 120 and the upper electrode 150 may be uniformly grown in a direction starting from the lower substrate 110 toward the upper substrate 160. At this point, when Cr is contained within the above-described range, Cu may be uniformly grown in one direction.

Hereinafter, a performance improvement result of a case in which an electrode contains grains grown in a direction of the C-axis according to an embodiment of the present invention will be described.

Table 1 is a table for analyzing a difference of power generation according to a volume ratio of grains grown in the direction of the C-axis in an electrode in a high temperature range of 100° C. or higher, and Table 2 is a table for analyzing a difference of power generation according to a volume ratio of grains grown in the direction of the C-axis in the electrode in a low temperature range at a level of body heat. In Table 1, a bulk thermoelectric leg of 40*40 mm$^2$ was employed, and in Table 2, a thin film thermoelectric leg was employed.

TABLE 1

| | Volume Ratio in C-axis | | | | |
| --- | --- | --- | --- | --- | --- |
| | Less than 10% | 10~50% | 50~65% | 65~95% | Exceeding 95% |
| Power Generation | 450 mW/cm$^2$ | 457 mW/cm$^2$ | 468 mW/cm$^2$ | 474 mW/cm$^2$ | >477 mW/cm$^2$ |

TABLE 2

| | Volume Ratio in C-axis | | | | |
| --- | --- | --- | --- | --- | --- |
| | below 10% | 10~50% | 50~65% | 65~95% | over 95% |
| Power Generation | 30 μW/cm$^2$ | 42.5 μW/cm$^2$ | 55.5 μW/cm$^2$ | 62.5 μW/cm$^2$ | >70 μW/cm$^2$ |

Referring to Table 1 in the high temperature range, it can be seen that, when the electrode contains over 95 vol % of grains grown in the direction of the C-axis, a dT value increased from 165K to 170K, that is, by about 5K, and power generation increased by about 6% (450 mW/cm$^2$→477 mW/cm$^2$) compared with a case in which the electrode contains below 10 vol % of the grains. Similarly, referring to Table 2 in the low temperature range, it can be seen that, when the electrode contains over 90 vol % of the grains grown in the direction of the C-axis, a dT value increased from 2K to 3K, that is, by about 1K, and power generation increased by about 2.4 times (30 μW/cm$^2$→70 μW/cm$^2$) compared with a case in which the electrode contains below 10 vol % of the grains.

Figure 7:
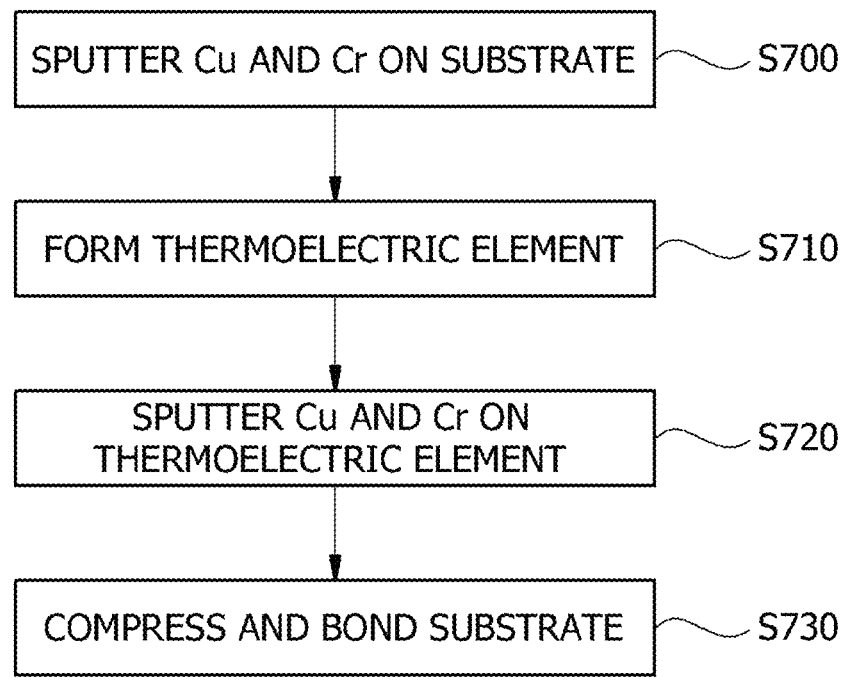
FIG. 7 shows a method of manufacturing a thermoelectric element according to one embodiment of the present invention.

FIG. 7 shows a method of manufacturing a thermoelectric element according to one embodiment of the present invention.

Referring to FIG. 7, Cu and Cr are sputtered to form a lower electrode 120 on the lower substrate 110 (S700). At this point, an alloy containing Cu in the range of 97.4 wt % to 99 wt % and Cr in the range of 1 wt % to 2.6 wt % of may be sputtered. Accordingly, the grains constituting the lower electrode 120 may be uniformly grown in the direction of the C-axis.

Further, a thermoelectric leg is formed on the lower electrode 120 which is deposited by sputtering (S710). At this point, a pre-manufactured bulk-type thermoelectric leg or a pre-manufactured stacked-type thermoelectric leg may be formed on the lower electrode 120. Alternatively, the thermoelectric leg may be formed by directly depositing a thermoelectric material on the lower electrode 120.

Next, Cu and Cr are sputtered again to form the upper electrode 150 on the thermoelectric leg (S720). Then, the upper substrate 160 is compressed and bonded on the upper electrode 150 which is formed as described above (S730).

Meanwhile, an example in which both the lower electrode and the upper electrode are grown in the direction of the C-axis is described in FIGS. 5 to 7, but the present invention is not limited thereto.

Figure 8:
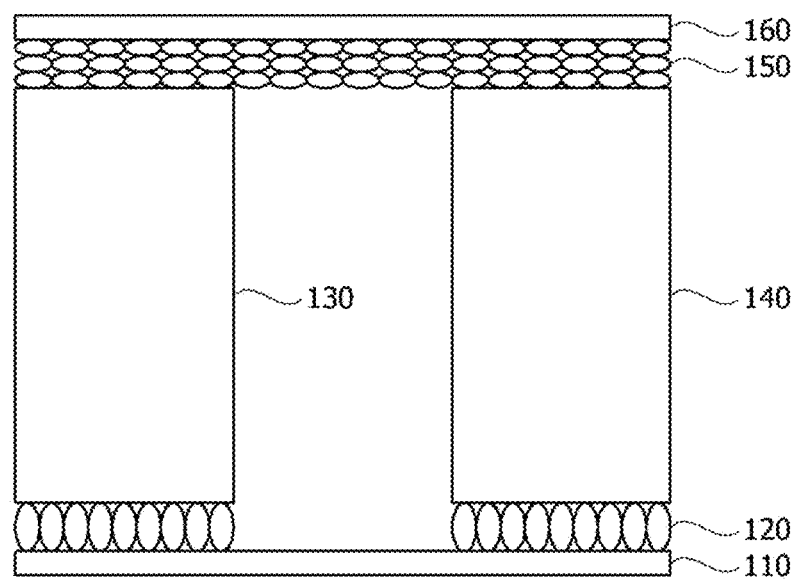
FIG. 8 is a cross-sectional view of a thermoelectric element according to another embodiment of the present invention.

FIG. 8 is a cross-sectional view of a thermoelectric element according to another embodiment of the present invention. A description overlapping with those of FIGS. 5 to 7 will be omitted.

Referring to FIG. 8, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are alternately disposed and are electrically connected by the lower electrode 120 and the upper electrode 150.

For example, when a voltage is applied to the lower electrode 120 and the upper electrode 150 through lead wires, the upper substrate 160 through which a current flows from the P-type thermoelectric leg 130 to the N-type thermoelectric leg 140 as a result of Peltier effect may absorb heat to serve as a cooling part, and the lower substrate 110 through which a current flows from the N-type thermoelectric leg 140 to the P-type thermoelectric leg 130 may be heated to serve as a heating part.

To this end, grains constituting the lower electrode 120 may be grown in a direction starting from the lower substrate 110 toward the upper substrate 160 (i.e., the C-axis). That is, the growth direction of the grains constituting the lower electrode 120 is the same as a direction of a heat flow in the N-type thermoelectric leg 140. Accordingly, probability of phonon scattering in the lower electrode 120 is minimized, and thus a heat flow from the N-type thermoelectric leg 140 to the lower substrate 110 via the lower electrode 120 is facilitated.

At this point, the lower electrode 120 is deposited by sputtering and may be formed of an alloy containing Cu and Cr.

On the other hand, grains constituting the upper electrode 150 may be formed in a growth direction different from the growth direction of the grains constituting the lower electrode 120. For example, the grains constituting the upper electrode 150 may be grown in a direction parallel to the upper substrate 160 (i.e., an a-b axis). At this point, the upper substrate 160 includes Cu and may be formed by electroplating. Accordingly, an electricity flow from the P-type thermoelectric leg 130 to the N-type thermoelectric leg 140 in the upper electrode 150 is facilitated.

As described above, when a heat flow in the lower electrode 120 brought into contact with the lower substrate 110 serving as the heating part is improved, and an electricity flow in the upper electrode 150 brought into contact with the upper substrate 160 serving as the cooling part is improved, performance of a cooling device including the thermoelectric element according to the present invention can be improved.

According to the embodiment of the present invention, the electrode may be formed as a double layer.

Figure 9:
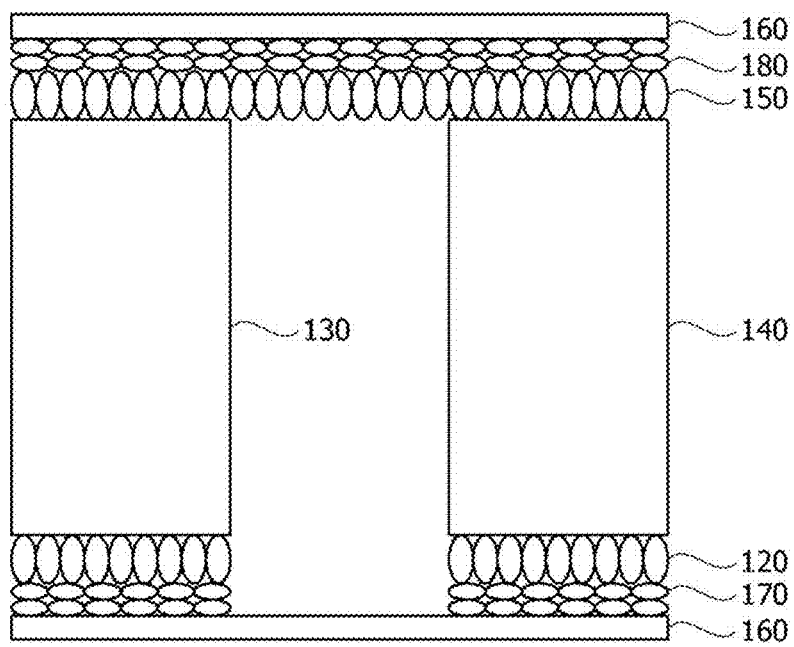
FIG. 9 is a cross-sectional view of a thermoelectric element according to still another embodiment of the present invention.
Figure 10:
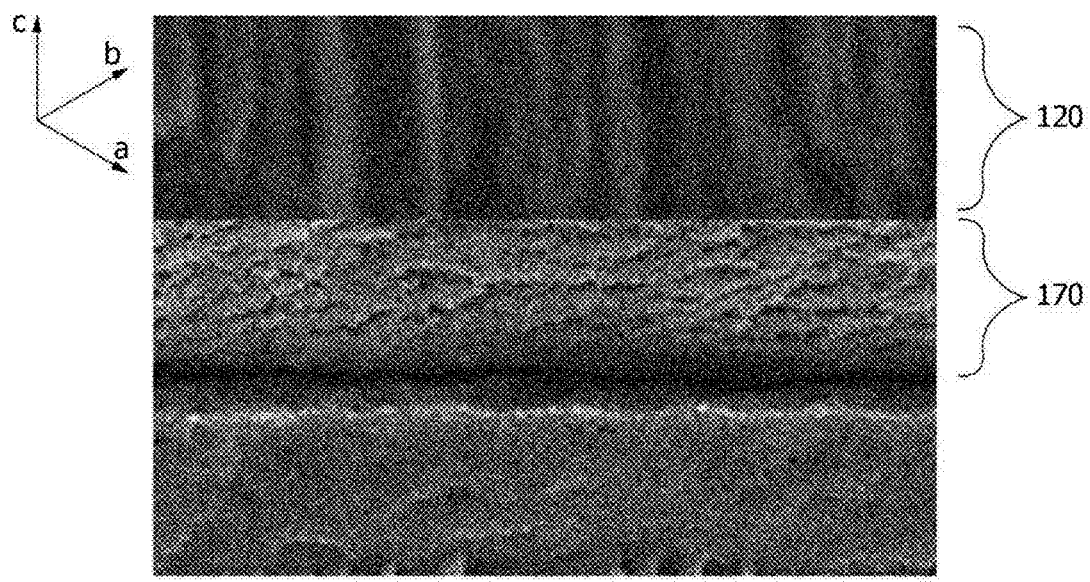
FIG. 10 is a SEM photograph of an electrode of the thermoelectric element of FIG. 9.

FIG. 9 is a cross-sectional view of a thermoelectric element according to still another embodiment of the present invention, and FIG. 10 is a SEM photograph of an electrode of the thermoelectric element of FIG. 9. A description overlapping with those of FIGS. 5 to 8 will be omitted.

Referring to FIGS. 9 and 10, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are alternately disposed and are electrically connected by the lower electrode 120 and the upper electrode 150.

At this point, grains constituting each of the lower electrode 120 and the upper electrode 150 may be grown in a direction starting from the lower substrate 110 toward the upper substrate 160 (i.e., the C-axis). That is, the growth direction of the grains constituting each of the lower electrode 120 and the upper electrode 150 is the same as a direction of a heat flow in each of the P-type thermoelectric leg 130 and the N-type thermoelectric leg 140. Accordingly, probability of phonon scattering in each of the lower electrode 120 and the upper electrode 150 is minimized, and thus a heat flow in each of the lower electrode 120 and the upper electrode 150 facilitated.

To this end, each of the lower electrode 120 and the upper electrode 150 is deposited by sputtering and may be formed of an alloy containing Cu and Cr.

Meanwhile, an additional lower electrode 170 may be further disposed between the lower electrode 120 and the lower substrate 110, and an additional upper electrode 180 may be further disposed between the upper electrode 150 and the upper substrate 160. At this point, grains constituting each of the additional lower electrode 170 and the additional upper electrode 180 may be grown in a direction different from the growth direction of the grains constituting each of the lower electrode 120 and the upper electrode 150. For example, the grains constituting each of the additional lower electrode 170 and the additional upper electrode 180 may be grown in a direction parallel to the lower substrate 110 and the upper substrate 160 (i.e., an a-axis or a b-axis). At this point, each of the additional lower electrode 170 and the additional upper electrode 180 includes Cu and may be formed by electroplating. As in the additional lower electrode 170 and the additional upper electrode 180, when Cu grains are grown in a direction parallel to the lower substrate 110 and the upper substrate 160 (i.e., the a-axis or the b-axis), an electricity flow in each of the additional lower electrode 170 and the additional upper electrode 180 is facilitated.

As described above, when an electrode is formed of a double layer according to the embodiments of the present invention, a heat flow between a thermoelectric leg and the electrode is facilitated and, at the same time, an electricity flow in the electrode is facilitated, so that thermoelectric performance of a thermoelectric element can be improved.

Alternatively, according to an embodiment of the present invention, grains may be grown in different directions even in a single electrode.

Figure 11:
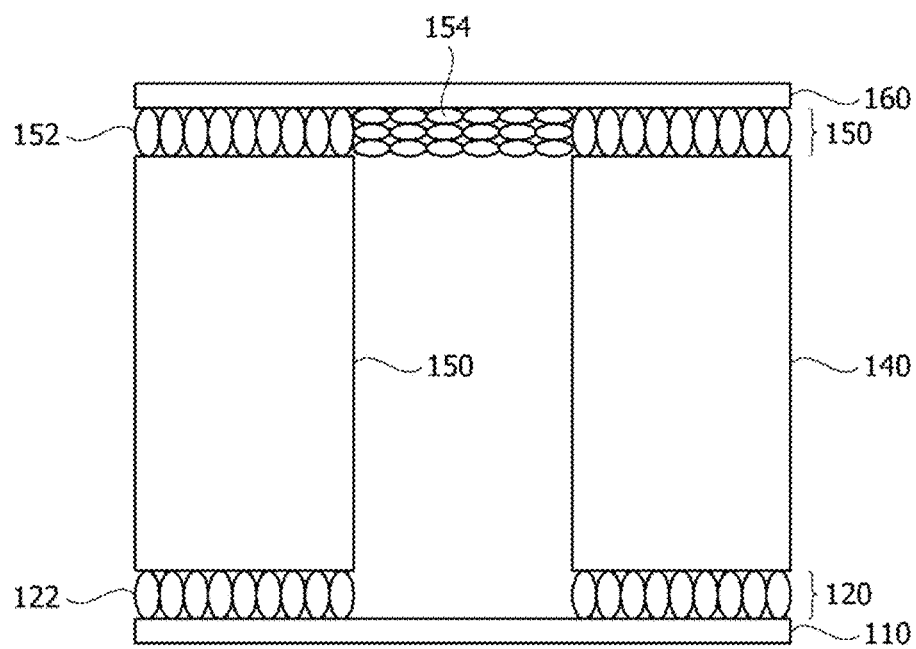
FIG. 11 is a cross-sectional view of a thermoelectric element according to yet another embodiment of the present invention.

FIG. 11 is a cross-sectional view of a thermoelectric element according to yet another embodiment of the present invention.

Referring to FIG. 11, a thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, a plurality of P-type thermoelectric legs 130 and a plurality of N-type thermoelectric legs 140 are alternately disposed and are electrically connected by the lower electrode 120 and the upper electrode 150.

At this point, the lower electrode 120 and the upper electrode 150 may include regions 122 and 152 in which grains are grown in a direction starting from the lower substrate 110 toward the upper substrate 160, i.e., the C-axis, and the upper electrode 150 may include a region 154 in which grains are grown in a direction parallel to the lower substrate 110 and the upper substrate 160, i.e., the a-axis or the b-axis.

The regions 122 and 152 in which the grains are grown from the lower substrate 110 toward the upper substrate 160, i.e., the C-axis, may be regions in contact with the P-type thermoelectric leg 130 and the N-type thermoelectric leg 140, and the region 154 in which the grains are grown in the direction parallel to the upper substrate 160, i.e., a-axis or b-axis, may be a region which is not brought into contact with the P-type thermoelectric leg 130 and the N-type thermoelectric leg 140.

Thus, when regions in contact with the P-type thermoelectric leg 130 and the N-type thermoelectric leg 140 are made of the regions 122 and 152 in which the grains are grown along the C-axis, a heat flow between a thermoelectric leg and an electrode may be facilitated. Further, when a region which is not brought into contact with the P-type thermoelectric leg 130 and the N-type thermoelectric leg 140 is made of the region 154 in which the grains are grown along the a-axis or the b-axis, an electricity flow in the electrode may be facilitated. Therefore, thermoelectric performance of a thermoelectric element can be improved.

Although the description has been made with reference to the exemplary embodiments of the present invention, it should be understood that various alternations and modifications of the present invention can be devised by those skilled in the art to which the present invention pertains without departing from the spirit and scope of the present invention, which are defined by the appended claims.

DESCRIPTION OF REFERENCE NUMERALS

100: thermoelectric element
110: lower substrate
120: lower electrode
130: P-type thermoelectric leg
140: N-type thermoelectric leg
150: upper electrode
160: upper substrate

The invention claimed is:

1. A thermoelectric element comprising:
a first substrate;
a first electrode disposed on the first substrate;
a thermoelectric leg disposed on the first electrode;
a second electrode disposed on the thermoelectric leg; and
a second substrate disposed on the second electrode,
wherein each of the first electrode and the second electrode includes a plurality of grains,
wherein the plurality of grains in the first electrode are disposed such that two furthest points of each grain are arranged in a first direction from the first substrate toward the second substrate, and
wherein the plurality of grains in the second electrode are disposed such that two furthest points of each grain are arranged in a second direction different from the first direction.

2. The thermoelectric element of claim 1, wherein the plurality of grains in the first electrode contains copper (Cu) and chromium (Cr).

3. The thermoelectric element of claim 2, wherein the first electrode is an alloy containing Cu in a range of 97.4 to 99 wt % and Cr in a range of 1 to 2.6 wt %.

4. The thermoelectric element of claim 1, wherein the second direction is parallel to the first substrate and the second substrate.

5. The thermoelectric element of claim 1, further comprising third electrode disposed between the first substrate and the thermoelectric leg, and a fourth electrode disposed between the second substrate and the thermoelectric leg.

6. The thermoelectric element of claim 5, wherein:
the third electrode and the fourth electrode respectively include a plurality of grains,
the plurality of grains in the third electrode are disposed such that two furthest points of each grain are arranged in a third direction different from the first direction; and
the plurality of grains in the fourth electrode are disposed such that two furthest points of each grain are arranged in a fourth direction different from the second direction.

7. The thermoelectric element of claim 6, wherein the third direction is parallel to the first substrate and the second substrate.

8. The thermoelectric element of claim 7, wherein the plurality of grains included in each of the first electrode and the fourth electrode contain Cu and Cr, and the plurality of grains included in each of the third electrode and the second electrode contain Cu.

9. The thermoelectric element of claim 1, wherein at least one of the first electrode and the second electrode includes a region in which the plurality of grains are disposed in the first direction and a region in which the plurality of grains are disposed in the second direction.

10. The thermoelectric element of claim 9, wherein the second substrate, and the second direction is parallel to the first substrate and the second substrate.

11. The thermoelectric element of claim 10, wherein the region in which the plurality of grains are disposed in the first direction is a region in contact with the thermoelectric leg, and the region in which the plurality of grains are disposed in the second direction is a region which is not brought into contact with the thermoelectric leg.

12. A cooling device including a thermoelectric element, comprising:
a first substrate;
a first electrode disposed on the first substrate;
a thermoelectric leg disposed on the first electrode;
a second electrode disposed on the thermoelectric leg; and
a second substrate disposed on the second electrode,
wherein each of the first electrode and the second electrode includes a plurality of grains,
wherein the plurality of grains in the first electrode are disposed such that two furthest points of each grain are arranged in a first direction from the first substrate toward the second substrate, and
wherein the plurality of grains in the second electrode are disposed so that two furthest points of each grain are arranged in a second direction different from the first direction.

13. The cooling device of claim 12, wherein the plurality of grains included in the first electrode contain copper (Cu) and chromium (Cr).

14. The cooling device of claim 12, wherein at least one of the first electrode and the second electrode includes a region in which the plurality of grains are disposed in the first direction and a region in which the plurality of grains are disposed in the second direction.

* * * * *